United States Patent
Han et al.

(10) Patent No.: US 10,969,438 B2
(45) Date of Patent: Apr. 6, 2021

(54) SECONDARY BATTERY AND LIFE PREDICTION APPARATUS THEREOF

(71) Applicant: LG CHEM, LTD., Seoul (KR)

(72) Inventors: Song-Yi Han, Daejeon (KR); Young-Geun Choi, Daejeon (KR); Song-Taek Oh, Daejeon (KR)

(73) Assignee: LG CHEM, LTD., Seoul (KR)

( * ) Notice: Subject to any disclaimer, the term of this patent is extended or adjusted under 35 U.S.C. 154(b) by 287 days.

(21) Appl. No.: 16/078,799

(22) PCT Filed: Sep. 28, 2017

(86) PCT No.: PCT/KR2017/010882
§ 371 (c)(1),
(2) Date: Aug. 22, 2018

(87) PCT Pub. No.: WO2018/080043
PCT Pub. Date: May 3, 2018

(65) Prior Publication Data
US 2019/0064275 A1    Feb. 28, 2019

(30) Foreign Application Priority Data

Oct. 25, 2016  (KR) .......................... 10-2016-0139389

(51) Int. Cl.
*G01R 31/387*       (2019.01)
*H01M 10/052*      (2010.01)
(Continued)

(52) U.S. Cl.
CPC ......... *G01R 31/387* (2019.01); *G01R 31/392* (2019.01); *H01M 10/052* (2013.01);
(Continued)

(58) Field of Classification Search
CPC .................................................... G01R 31/387
See application file for complete search history.

(56) References Cited

U.S. PATENT DOCUMENTS

2003/0041445 A1    3/2003  Jang et al.
2011/0077879 A1*   3/2011  Paryani ................. H02J 7/0071
                                                        702/63
(Continued)

FOREIGN PATENT DOCUMENTS

CN        103795108 A     5/2014
CN        103837833 A     6/2014
(Continued)

OTHER PUBLICATIONS

Abraham, "Diagnostic Studies on Lithium-Ion Cells at Argonne National Laboratory—An Overview," Invited Paper, Proc. of SPIE, vol. 7683, 2010, pp. 76830A-1 to 76830A-10.
(Continued)

*Primary Examiner* — Hyun D Park
(74) *Attorney, Agent, or Firm* — Birch, Stewart, Kolasch & Birch, LLP

(57) ABSTRACT

Disclosed are a secondary battery and a life prediction apparatus thereof. The life prediction apparatus predicts a life of a secondary battery including an electrode assembly, a positive electrode tab, a negative electrode tab, a case and a plurality of reference electrodes. In particular, the life prediction apparatus predicts a residual life of the secondary battery by detecting impedances of different regions of the secondary battery by using the plurality of reference electrodes.

4 Claims, 4 Drawing Sheets

(51) Int. Cl.
*H01M 10/48* (2006.01)
*G01R 31/392* (2019.01)
*H01M 10/42* (2006.01)
*H01M 50/10* (2021.01)
*H01M 50/20* (2021.01)
*H01M 50/172* (2021.01)
*H01M 50/183* (2021.01)

(52) U.S. Cl.
CPC ..... *H01M 10/425* (2013.01); *H01M 10/4285* (2013.01); *H01M 10/48* (2013.01); *H01M 50/10* (2021.01); *H01M 50/172* (2021.01); *H01M 50/20* (2021.01); *H01M 10/4235* (2013.01); *H01M 50/183* (2021.01); *Y02E 60/10* (2013.01)

(56) References Cited

U.S. PATENT DOCUMENTS

| | | |
|---|---|---|
| 2013/0323542 A1 | 12/2013 | Wijayawardhana et al. |
| 2014/0023888 A1 | 1/2014 | Fulop et al. |
| 2015/0214582 A1 | 7/2015 | Skwarek et al. |
| 2015/0276888 A1 | 10/2015 | Sakai |
| 2015/0288197 A1 | 10/2015 | Choi |

FOREIGN PATENT DOCUMENTS

| | | | |
|---|---|---|---|
| JP | 2016-48213 | A | 4/2016 |
| JP | 2017-069011 | A | 4/2017 |
| KR | 10-1999-0015309 | A | 3/1999 |
| KR | 10-2003-0020122 | A | 3/2003 |
| KR | 10-2010-0075913 | A | 7/2010 |
| KR | 10-2012-0071600 | A | 7/2012 |
| KR | 10-2013-0124326 | A | 11/2013 |
| KR | 10-2014-0131079 | A | 11/2014 |
| KR | 10-2015-0060373 | A | 6/2015 |
| KR | 10-2016-0049680 | A | 5/2016 |
| KR | 10-1658461 | B1 | 9/2016 |
| WO | WO 03/041209 | A2 | 5/2003 |
| WO | 10-2015-0025932 | A | 3/2015 |

OTHER PUBLICATIONS

Wasterlain et al., "First Results Obtained with an Impedance Meter Developed for the Diagnosis of Large Proton-Exchange-Membrane Fuel-Cell Stacks," Electromotion 2009—EPE Chapter 'Electric Drives' Joint Symposium, Lille, France, Jul. 1-3, 2009, 6 pages.
International Search Report for PCT/KR2017/010882 (PCT/ISA/210) dated Feb. 2, 2018.
English translation of KR-10-2016-0049680 (Previously filed Aug. 22, 2018), Publication date May 10, 2016.

* cited by examiner

US 10,969,438 B2

SECONDARY BATTERY AND LIFE PREDICTION APPARATUS THEREOF

TECHNICAL FIELD

The present disclosure relates to a secondary battery and a life prediction apparatus of the secondary battery, and more particularly, to a secondary battery having a plurality of reference electrodes located with different distances from an electrode tab, and an apparatus for predicting a life thereof.

The present application claims priority to Korean Patent Application No. 10-2016-0139389 filed on Oct. 25, 2016 in the Republic of Korea, the disclosures of which are incorporated herein by reference.

BACKGROUND ART

In recent years, demand for portable electronic products such as notebook computers, video cameras, portable telephones and the like has been drastically increased and electric vehicles, storage batteries for energy storage, robots, satellites and the like have been actively developed. For this reason, high performance secondary batteries capable of repeated charge and discharge have been actively studied.

Lithium secondary batteries currently commercially available include nickel-cadmium batteries, nickel-hydrogen batteries, nickel-zinc batteries and lithium secondary batteries. Among them, the lithium secondary batteries are in the spotlight because they have almost no memory effect compared to nickel-based secondary batteries, and thus perform charge and discharge freely, have very low self-discharge rate and have high energy density.

In order to use a secondary battery safely for a long time, it is most important to accurately detect a state of charge (SOC) and a state of health (SOH) of the secondary battery. In particular, the SOH of a secondary battery is an indicator representing a period during which the secondary battery is useable, and is generally guided to a user through a display as a ratio of a current residual life to a life span when the secondary battery is released.

The impedance of the secondary battery gradually increases as the secondary battery degrades. In other words, the impedance of the secondary battery reflects an internal Ohm resistance of the secondary battery (hereinafter, referred to as 'AC resistance'), which is one of main parameters affecting the SOH.

As a technique for measuring the impedance of a secondary battery, Korean Patent Publication No. 10-2014-0131079 (published on Nov. 12, 2014) that is a first patent literature and Korean Patent Publication No. 10-2015-0025932 (Public on Mar. 11, 2015) that is a second patent literature have been disclosed. The first patent literature is directed to reducing an impedance measurement error of the secondary battery, and the second patent literature is directed to estimating a life of the battery during a charging process.

However, the prior art including the first and second patent literatures do not consider the fact that different regions of the secondary battery are unevenly degraded due to heat generated from an electrode tab while the secondary battery is repeatedly charged and discharged from its initial use to the present, when predicting the life of the secondary battery (namely, when calculating the SOH).

In more detail, as the secondary battery is repeatedly charged and discharged, the heat generated due to the contact resistance of the electrode tab accumulates irreversible damage to the secondary battery. As a result, a region closer to the electrode tab is degraded relatively faster in comparison to a region farther from the electrode tab. Thus, if the life of the secondary battery is predicted without considering various degeneration rates of regions of the secondary battery, caused by the heat generated from the electrode tab, the accuracy of the prediction may be lowered.

DISCLOSURE

Technical Problem

The present disclosure is designed to solve the problems of the related art, and therefore the present disclosure is directed to providing a secondary battery configured to predict a life by considering the change of impedance reflecting the variation of a degeneration rate according to the distance from an electrode tab of the secondary battery, and a life prediction apparatus including the same.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

The followings are various embodiments of the present disclosure to accomplish the above object.

In one aspect of the present disclosure, there is provided a life prediction apparatus of a secondary battery that includes an electrode assembly, a positive electrode tab, a negative electrode tab, a case and a plurality of reference electrodes. The life prediction apparatus comprises an electrode selection unit configured to select designated reference electrodes at least once at every predetermined cycle, as a response to an electrode selection signal designating at least two of the plurality of reference electrodes; an impedance measurement unit configured to measure an impedance associated with the selected reference electrode, based on an AC voltage between any one of the positive electrode tab and the negative electrode tab and the selected reference electrode with respect to an AC current of a predetermined frequency band, in a state where any one of the plurality of reference electrodes is selected by the electrode selection unit; and a control unit configured to transmit the electrode selection signal to the electrode selection unit, and when the impedance of each of the designated reference electrodes is completely measured by the impedance measurement unit, to predict a residual life of the secondary battery based on the measured impedance.

In addition, the plurality of reference electrodes may include: a first reference electrode having one end disposed in the case and connected to a first reference location of the separator and the other end protruding out of the case; and a second reference electrode having one end disposed in the case and connected to a second reference location of the separator, which is different from the first reference location, and the other end protruding out of the case.

In addition, the impedance measurement unit may measures a first impedance associated with the first reference electrode when the first reference electrode is selected by the electrode selection unit, and the impedance measurement unit may measure a second impedance associated with the second reference electrode when the second reference electrode is selected by the electrode selection unit. In this case, the control unit may predict a residual life of the secondary battery based on the first impedance and the second impedance.

In addition, a distance from a first connection location where the positive electrode tab contacts the positive electrode plate to the first reference location may be shorter than a distance from the first connection location to the second reference location. In this case, the control unit may predict a residual life of the secondary battery based on a ratio of the first impedance to the second impedance.

In addition, the plurality of reference electrodes may further include a third reference electrode having one end disposed in the case and connected to a third reference location of the separator and the other end protruding out of the case. Preferably, a distance from the first connection location to the third reference location may be longer than a distance from the first connection location to the first reference location and shorter than a distance from the first connection location to the second reference location. In this case, the control unit may transmit an electrode selection signal designating a selection of the third reference electrode to the electrode selection unit when the ratio of the first impedance to the second impedance is equal to or greater than a reference value.

In another aspect of the present disclosure, there is also provided a battery pack, comprising the life prediction apparatus.

In another aspect of the present disclosure, there is also provided a secondary battery, comprising: an electrode assembly having a positive electrode plate, a negative electrode plate and a separator located between the positive electrode plate and the negative electrode plate; a case configured to accommodate the electrode assembly; a positive electrode tab configured to have one end connected to the positive electrode plate at an inside of the case and the other end protruding out of the case; a negative electrode tab configured to have one end connected to the negative electrode plate at the inside of the case and the other end protruding out of the case; and a plurality of reference electrodes configured to be spaced apart from the positive electrode tab and the negative electrode tab. Each of the reference electrodes include one end connected to the separator at the inside of the case and the other end protruding out of the case.

In addition, the case may include a first sealing portion formed in a region of an outer circumference of the case, which extends along a first direction, and having at least a partial region vertically contacting a partial portion between one end and the other end of the positive electrode tab or the negative electrode tab; and a second sealing portion formed in a region of the outer circumference of the case, which extends along a second direction different from the first direction, and having at least a partial region contacting a partial portion between one end and the other end of at least one of the plurality of reference electrodes.

In addition, the plurality of reference electrodes may include a first reference electrode having one end disposed in the case and connected to a first reference location of the separator and the other end protruding out of the case; and a second reference electrode having one end disposed in the case and connected to a second reference location of the separator, which is different from the first reference location, and the other end protruding out of the case.

In addition, a distance from a first connection location where the positive electrode tab contacts the positive electrode plate to the first reference location may be different from a distance from the first connection location to the second reference location.

In addition, the plurality of reference electrodes may further include a third reference electrode having one end disposed in the case and connected to a third reference location of the separator and the other end protruding out of the case. In this case, a distance from the first connection location to the third reference location may be different from distances from the first connection location to the first reference location and the second reference location.

Advantageous Effects

According to at least one of the embodiments of the present disclosure, it is possible to provide a secondary battery including a plurality of reference electrodes disposed at different distances from at least one of a positive electrode tab and a negative electrode tab so as to detect a change of impedance of each region of the secondary battery due to the heat generated from the electrode tab.

Also, according to at least one of the embodiments of the present disclosure, it is possible to provide a life prediction apparatus capable of predicting a residual life of a secondary battery more accurately by detecting the impedance of different regions of the secondary battery using a plurality of reference electrodes disposed at different differences from the electrode tab.

The effects of the present disclosure are not limited to the effects mentioned above, and other effects not mentioned herein may be clearly understood from the appended claims by those skilled in the art.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

In addition, in the present disclosure, if it is judged that detailed explanation on a known technique or configuration may unnecessarily make the essence of the present disclosure vague, the detailed explanation will be omitted.

Throughout the specification, when a portion is referred to as "comprising" or "including" any element, it means that the portion may include other elements further, not excluding other elements unless specifically stated otherwise. Furthermore, the term "control unit" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Hereinafter, a secondary battery according to an embodiment of the present disclosure will be described. Meanwhile, as disclosed in the second patent document and the like, the technique for estimating a life of a battery by using a parameter indicating the impedance of the battery is already well known in the art and thus will not be described in detail.

Figure 1:
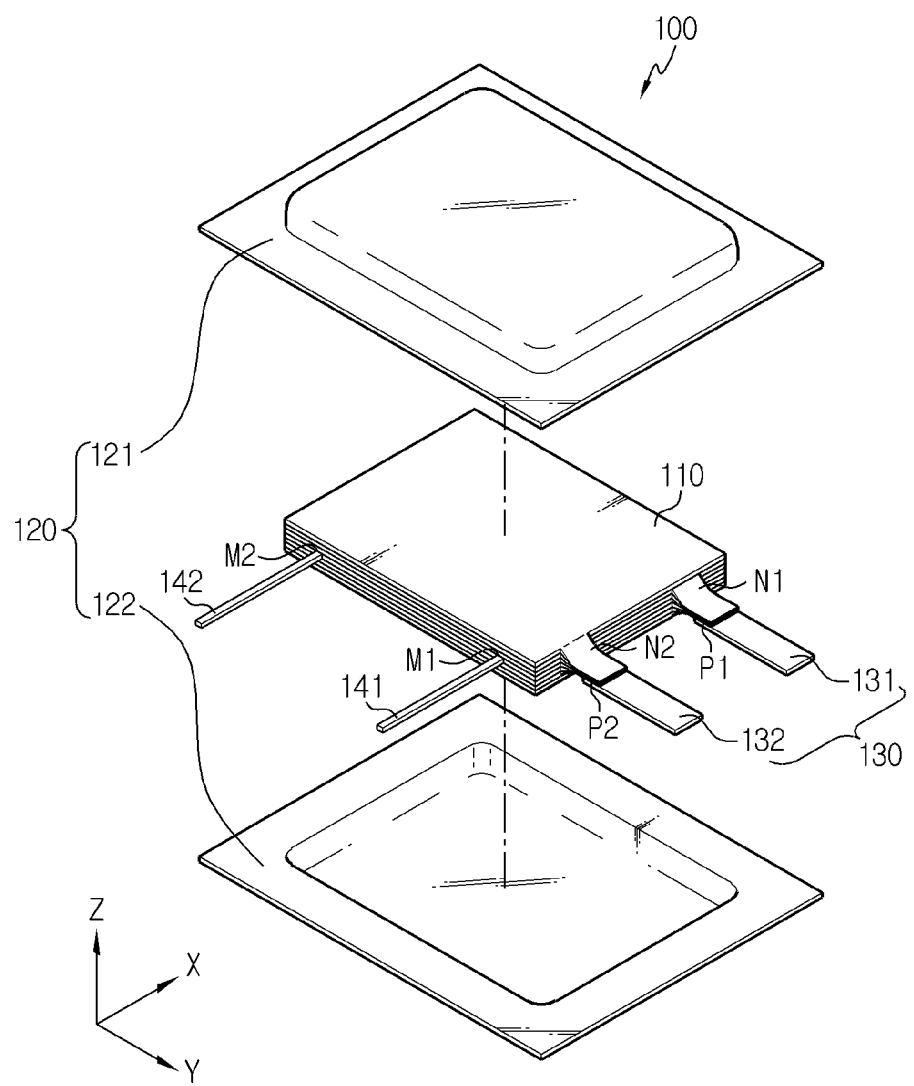
FIG. 1 is an exploded perspective view schematically showing a structure of a secondary battery including two reference electrodes according to an embodiment of the present disclosure.
Figure 2:
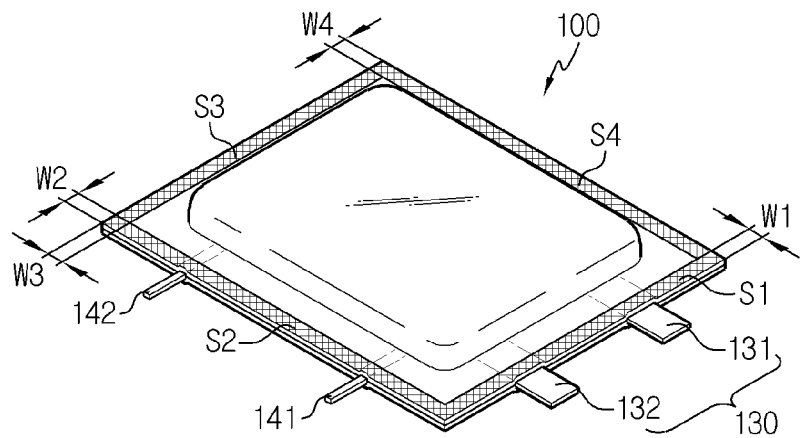
FIG. 2 is a perspective view showing the secondary battery of FIG. 1 in an assembled state.

FIG. 1 is an exploded perspective view schematically showing a structure of a secondary battery 100 including two reference electrodes according to an embodiment of the present disclosure, and FIG. 2 is a perspective view showing the secondary battery 100 of FIG. 1 in an assembled state.

Referring to FIGS. 1 and 2, the secondary battery 100 includes an electrode assembly 110, a case 120, an electrode tab 130, a first reference electrode 141 and a second reference electrode 142.

The electrode assembly 110 includes at least one positive electrode plate, at least one negative electrode plate and at least one separator. Each positive electrode plate and each negative electrode plate included in the electrode assembly 110 may be configured to be disposed so that a separator is interposed therebetween. In other words, a separator may be located at every region between the positive electrode plates and the negative electrode plates. At this time, the separator may be fabricated in a film form and repeatedly folded into a predetermined shape (for example, a zigzag form) to separate each positive electrode plate included in the electrode assembly 110 from each negative electrode plate. Alternatively, the electrode assembly 110 may include a plurality of separators that are respectively disposed one by one between the positive electrode plates and the negative electrode plates sequentially stacked.

The positive electrode plate and the negative electrode plate are physically separated from each other by the separator, which may prevent a short circuit from each other. At this time, the electrode assembly 110 may be accommodated in the case 120 in a state where a plurality of positive electrode plates and a plurality of negative electrode plates are alternately stacked. Alternatively, the electrode assembly 110 may also be accommodated in the case 120 in a state where one positive electrode plate and one negative electrode plate are wound. The positive electrode plate and the negative electrode plate may be generally referred to as 'electrode plates'.

Each electrode plate included in the electrode assembly 110 is formed as a structure in which active material slurry is coated on a current collector. Here, the slurry may be usually formed by stirring a granular active material, an auxiliary conductor, a binder and a plasticizer in a solvent. In addition, at least one positive electrode plate and at least one negative electrode plate may have uncoated portions N1, N2 that are not coated with the slurry, and the uncoated portions N1, N2 may protrude from the other regions of the positive electrode plate and the negative electrode plate to contact the electrode tab 130, explained later.

The case 120 has a concave inner space formed therein, and the electrode assembly 110 and the electrolyte are accommodated in the inner space. In particular, the case 120 may include an outer insulation layer and an inner adhesive layer made of a polymer material, and a metal layer interposed between the outer insulation layer and the inner adhesive layer. Here, as the metal layer of case 120 may be made of aluminum, but the present disclosure is not limited thereto.

The case 120 may include an upper pouch 121 and a lower pouch 122. At this time, the inner space capable of accommodating the electrode assembly 110 may be formed in both the upper pouch 121 and the lower pouch 122, or on only one of the upper pouch 121 and the lower pouch 122, as shown in FIGS. 1 and 2.

In FIG. 1, it is depicted that the upper pouch 121 and the lower pouch 122 are in a completely separated state and contact each other through a sealing portion, but the present disclosure is not limited thereto. For example, the upper pouch 121 may be fabricated to be connected to the lower pouch 122 through at least one edge, and then be coupled thereto so that other edges are joined, thereby sealing the electrode assembly 110 from the outside.

Meanwhile, if the electrode assembly 110 is accommodated in the space provided by the upper pouch 121 and the lower pouch 122, a rim area formed along an outer circumference of the upper pouch 121 and a rim area formed along an outer circumference of the lower pouch 122 are adhered (for example, by heat welding) to each other by means of adhesive layers located at inner sides thereof to face each other, so that the inner space is sealed.

The uncoated portions N1, N2 of the positive electrode plate and the negative electrode plate are extended from the electrode assembly 110 toward the sealing portion of the case 120, compared with the other regions, and may be connected to a positive electrode tab 131 and a negative electrode tab 132, respectively.

The electrode tab 130 generally refers to the positive electrode tab 131 and the negative electrode tab 132 and is a component for electrically connecting the secondary battery 100 to another secondary battery 100 or another device at the outside. For example, a plurality of secondary batteries 100 constituting a battery pack may be electrically connected to each other via a bus bar. In this case, the electrode tab 130 may be configured to directly contact the bus bar. Since the electrode tab 130 is used for electrical connection at the inside or outside of the secondary battery 100, at least a part of the electrode tab 130 may be made of an electrically conductive material such as a metal.

Each of the positive electrode tabs 131 and the negative electrode tabs 132 is provided to extend from an inner side of the case 120 to an outer side of the case 120 so that at least a portion thereof may be interposed between the sealing portions of the case 120.

In detail, the positive electrode tab 131 is configured such that one end is connected to the positive electrode plate at the inside of the case 120 and the other end protrudes out of the case 120. The negative electrode tab 132 is also configured such that one end is connected to the negative electrode plate at the inside of the case 120 and the other end protrudes out of the case 120. The uncoated portion N1 of the positive electrode plate and the uncoated portion N2 of the negative electrode plate may be mechanically connected and fixed to one end of the positive electrode tab 131 and the negative electrode tab 132 by welding or the like, respectively. As will be described later, heat is generated at a point P1 (hereinafter, referred to as a 'first connection point') at which the uncoated portion N1 of the positive electrode plate contacts the positive electrode tab 131 and a point P2 (hereinafter, referred to as a 'second connection point') at which the uncoated portion N2 of the negative electrode plate contacts the negative electrode tab 132, due to contact resistance generated by a current flowing while during charging and discharging the secondary battery 100. The heat generated from the first connection point P1 and the second connection point P2 spreads to other regions of the secondary battery 100. Accordingly, a region closer to the first connection point P1 and/or the second connection point P2 is degraded faster and has more increased impedance.

The reference electrodes 141, 142 are configured to be spaced apart from the positive electrode tab 131 and the negative electrode tab 132. Specifically, each of the reference electrodes 141, 142 is configured such that one end may be connected to the separator of the electrode assembly 110 at the inside of the case 120, and the other end protrudes out of the case 120.

At this time, one end of the reference electrodes 141, 142 may be inserted between any one separator and any one positive electrode plate in the case 120. Alternatively, one end of the reference electrodes 141, 142 may be inserted between any one separator and any one negative electrode plate in the case 120.

If the electrode assembly 110 includes a plurality of separators, the separator to which any one of the plurality of reference electrodes is connected may differ from the separator to which at least one of the other reference electrodes is connected. Alternatively, the plurality of reference electrodes may also be connected to the same separator commonly.

The separator may have a folded or stacked structure along a z-axis direction corresponding to the thickness of the electrode assembly 110. Thus, if a plurality of reference electrodes including the first and second reference electrodes 141, 142 are distributed and connected to several points of the separator with different z-axis coordinates, it is possible to measure the impedance reflecting the deviation of the degeneration rate of the electrode assembly 110 in the z-axis direction due to the heat generated from the electrode tab 130 by using the life prediction apparatus 200 described later.

Hereinafter, for convenience of explanation, it is assumed that one end of the first reference electrode 141 is connected to a first reference location M1 of any one separator and one end of the second reference electrode 142 is connected to a second reference location M2 of the same separator.

As shown in the figures, the y-axis coordinate of the first reference location M1 may be smaller than the y-axis coordinate of the second reference location M2 based on any one of the first connection location P1 and the second connection location P2. In this case, a linear distance from the first connection location P1 to the second reference location M2 is shorter than a linear distance from the first connection location P1 to the first reference location M1.

Each reference electrode 141, 142 may include at least a conductive wire (for example, a copper wire). Preferably, a portion of each reference electrode 141, 142 other than a predetermined region from one end and a predetermined region from the other end may be coated with an insulating material (for example, enamel). In addition, one end of each reference electrode that is not coated with an insulating material may be coated with nonaqueous slurry containing lithium titanium compound (LTO). Preferably, the nonaqueous slurry coating one end of each reference electrode may be a mixture of LTO, conductive material and a binder at a predetermined ratio. Accordingly, when each of the reference electrodes 141, 142 is connected to the separator of the electrode assembly 110, the risk of short circuit may be reduced.

Referring to FIG. 2, a plurality of sealing portions S1 to S4 connected to each other along the outer circumference of the case 120 may be formed at the case 120. Specifically, the case 120 may include a first sealing portion S1 formed in a region of the outer circumference extending along a first direction (for example, an x-axis direction) and a second sealing portion S2 formed in a region of the outer circumference extending along a second direction (for example, a y-axis direction). For example, the x-axis may correspond to a direction in which the width of the secondary battery 100 extends, the y-axis may correspond to a direction in which the length of the secondary battery 100 extends, and the z-axis may correspond to a direction in which the thickness of the secondary battery 100 extends. In this way, the x-axis, the y-axis and the z-axis may be orthogonal to each other.

At least a partial region of the first sealing portion S1 vertically contacts a portion between one end and the other end of the positive electrode tab 131 and/or the negative electrode tab 132. For example, if the outer circumference of the case 120 is rectangular, the first sealing portion S1 may be formed at any one corner among four corners of the rectangle where the other end of the positive electrode tab 131 and/or the negative electrode tab 132 protrudes.

Also, at least a partial region of the second sealing portion S2 vertically contacts a portion between one end and the other end of at least one of the first reference electrode 141 and the second reference electrode 142. FIG. 2 depicts that the other ends of both the first reference electrode 141 and the second reference electrode 142 protrude outwards through the second sealing portion S2, but the present invention is not limited thereto.

Depending on the shape of the case 120, the sealing portion may further include a third sealing portion S3 and a fourth sealing portion S4. The third sealing portion S3 may be formed at a side opposite to the first sealing portion S1 with respect to the second sealing portion S2. The fourth sealing portion S4 may be formed at a side opposite to the third sealing portion S3 with respect to the first sealing portion S1. It will be apparent to those skilled in the art that any one of the widths W1 to W4 of the plurality of sealing portions S1 to S4 may be identical to or different from the other.

At this time, a portion between one end and the other end of at least one of the first reference electrode 141 and the second reference electrode 142 may be sealed up or down by the third sealing portion S3 or the fourth sealing portion S4 instead of the second sealing portion S2. That is, if the distances from the first connection point P1 and/or the second connection point P2 to the first reference electrode 141 and the second reference electrode 142 are different from each other, the positions where the first reference electrode 141 and the second reference electrode 142 are disposed may be freely changed.

Figure 3:
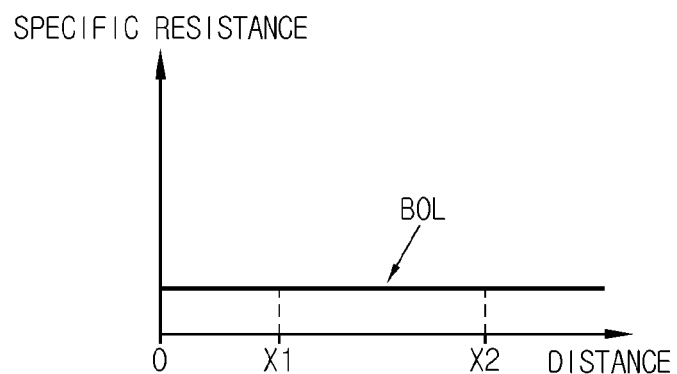
FIGS. 3 and 4 are reference views for illustrating a difference in degradation of regions of the secondary battery, caused by the heat generated from an electrode tab of the secondary battery depicted in FIGS. 1 and 2.
Figure 4:
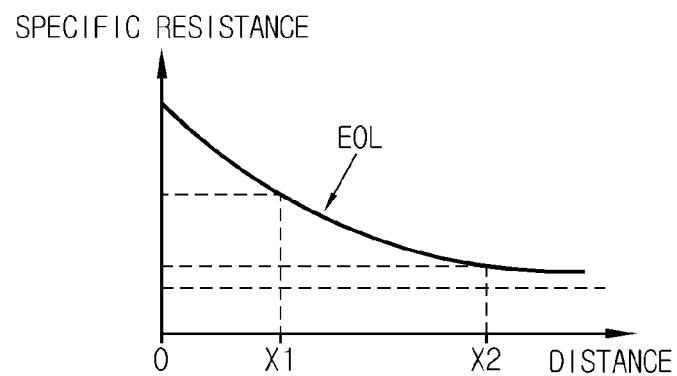

FIGS. 3 and 4 are reference views for illustrating a difference in degradation of regions of the secondary battery 100, caused by the heat generated from an electrode tab 130 of the secondary battery 100 depicted in FIGS. 1 and 2.

In FIGS. 3 and 4, 'O' represents the first connection point P1, 'X1' represents the first reference location M1, and 'X2' represents the second reference location M2.

FIG. 3 illustrates the specific resistance at each distance from the first connection point P1 when the secondary battery 100 is in a BOL state. The BOL state means a beginning of life of the secondary battery 100 whose cycle count is less than a predetermined value. In this case, as shown in FIG. 3, the specific resistance at the first reference location M1 may be negligibly different from the specific resistance at the second reference location M2.

FIG. 4 illustrates the specific resistance at each distance from the first connection point P1 when the secondary battery 100 is in an EOL state. The EOL state means an end of life of the secondary battery 100. In this case, contrary to the BOL, the secondary battery 100 has been already degraded seriously, no longer negligible, due to the heat generated at the electrode tab 130. In particular, as shown in FIG. 4, the specific resistance at the distance X1 corresponding to the first reference location M1 may be significantly greater than the specific resistance at the distance X2 corresponding to the second reference location M2. That is, in the first reference location M1 and the second reference location M2, it may be found that the increase in the specific resistance at the first reference location M1 relatively closer to the first connection point P1 is greater than the increase in the specific resistance at the second reference location M2 relatively farther from the first connection point P1.

Figure 5:
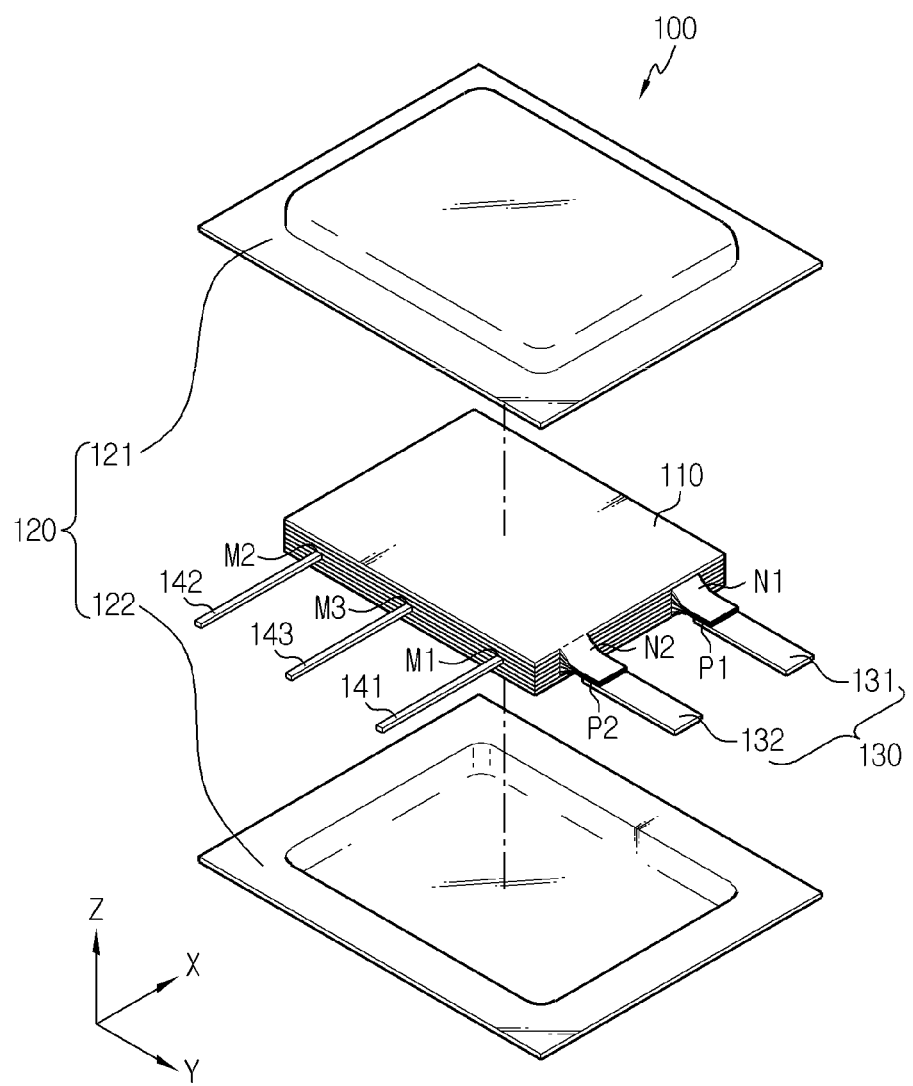
FIG. 5 is a perspective view showing a structure of a secondary battery including three reference electrodes according to another embodiment of the present disclosure.

FIG. 5 is a perspective view showing a structure of a secondary battery 100 including three reference electrodes according to another embodiment of the present disclosure.

Referring to FIG. 5, the secondary battery 100 of this embodiment is different from that of FIG. 4 just in the point that a third reference electrode 143 is added to the secondary battery 100, and other components are not different.

Like the first reference electrode 141 and the second reference electrode 142, the third reference electrode 143 is configured to be spaced apart from the positive electrode tab 131 and the negative electrode tab 132. Also, the third reference electrode 143 may be configured such that one end is connected to the separator of the electrode assembly 110 at the inside of the case 120, and the other end protrudes out of the case 120.

In this case, one end of the third reference electrode 143 may be commonly connected to the separators connected to one ends of the first reference electrode 141 and the second reference electrode 142. At this time, one end of the third reference electrode 143 may be inserted between any one separator and any one positive electrode plate at the inside of the case 120. Alternatively, one end of third reference electrode 143 may be inserted between any one separator and any one negative electrode plate at the inside of the case 120.

Preferably, a third reference location M3 at which one end of the third reference electrode 143 is connected to the separator may be different from the first reference electrode 141 and the second reference location M2.

Alternatively, one end of the third reference electrode 143 may be connected to a separator other than the separator connected to one end of the first reference electrode 141 and the second reference electrode 142.

Preferably, a distance from the first connection location P1 to the third reference location M3 may be greater than the distance from the first connection point P1 to the first reference location M1 and shorter than the distance from the first connection point P1 to the second reference location M2. That is, the third reference location M3 may be a specific portion between the first reference location M1 and the second reference location M2. For example, if all of the other ends of the first to third reference electrodes 143 protrude out through the second sealing portion S2, the third reference electrode 143 may be disposed in parallel to the first reference electrode 141 and the second reference electrode 142 between the first reference electrode 141 and the second reference electrode 142.

The secondary battery 100 may further include an additional reference electrode, in addition to the first to third reference electrodes 141, 142, 143.

Figure 6:
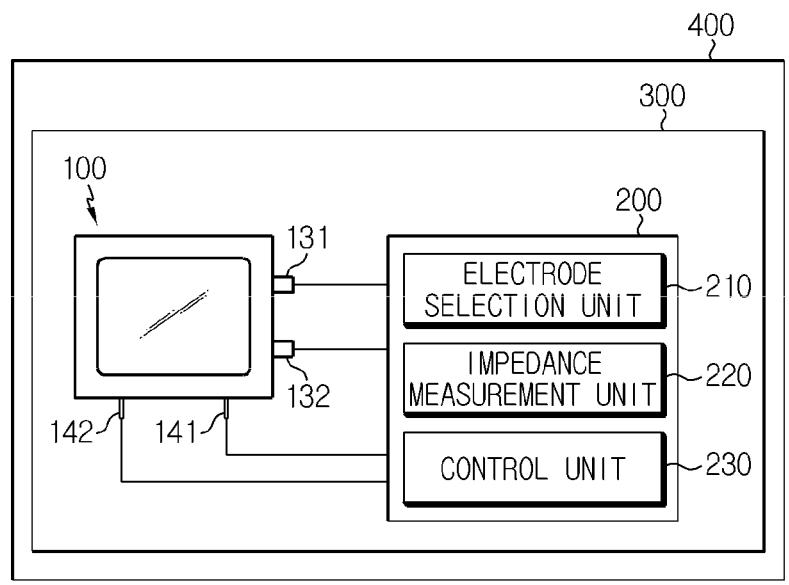
FIG. 6 is a block diagram schematically showing a functional configuration of a life prediction apparatus of a secondary battery according to an embodiment of the present disclosure.
Figure 7:
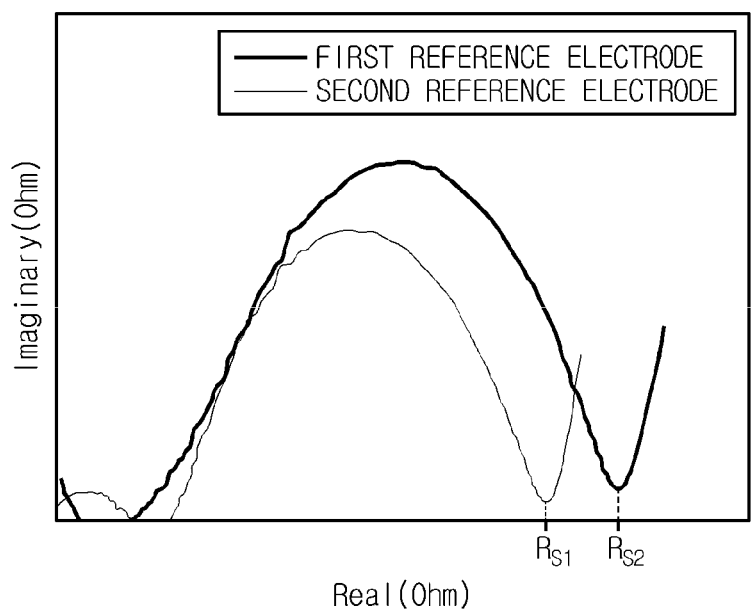
FIG. 7 shows an impedance spectrum measured by the life prediction apparatus depicted in FIG. 6.

FIG. 6 is a block diagram schematically showing a functional configuration of a life prediction apparatus 200 of a secondary battery 100 according to an embodiment of the present disclosure, and FIG. 7 shows an impedance spectrum measured by the life prediction apparatus 200 depicted in FIG. 6.

Referring to FIG. 6, the life prediction apparatus 200 may include an electrode selection unit 210, an impedance measurement unit 220, and a control unit 230. According to an embodiment, the secondary battery 100 may be included in the life prediction apparatus 200. On occasions, the life prediction apparatus 200 may further include an information guiding unit for outputting the life of the secondary battery 100 predicted by the control unit 230 to a user with a visual and/or audible signal.

As shown in FIG. 6, the life prediction apparatus 200 may be included in a battery pack 300 together with at least one secondary battery 100. The battery pack may be included in a power system 400 such as an electric vehicle or an energy storage device.

The electrode selection unit 210 is configured to select at least one of the reference electrodes in response to an electrode selection signal transmitted from the control unit 230. The electrode selection signal is a signal for designating one or more of the plurality of reference electrodes included in the secondary battery. At this time, the electrode selection signal may be a signal for designating a selection order for two or more reference electrodes and/or a time interval between selection time points. The electrode selection unit 110 may select two or more reference electrodes designated by the electrode selection signal most recently transmitted from the control unit 230 at least once at every predetermined cycle.

The electrode selection unit 210 may include at least one switching element. For example, the electrode selection unit 210 may include a multiplexer.

The impedance measurement unit 220 is configured to measure the impedance between any one of the positive electrode tab 131 and the negative electrode tab 132 (hereinafter, referred to as a 'reference tab') and the reference electrode selected by the electrode selection unit 210.

For example, the impedance measurement unit 220 may measure a first impedance associated with the first reference electrode 141 in a state where the first reference electrode 141 is selected by the electrode selection unit 210, and then measure a second impedance associated with the second reference electrode 142 in a state where the second reference electrode 142 is selected by the electrode selection unit 210.

If any one reference electrode is selected by the electrode selection unit 210, the impedance measurement unit 220 may form a current path for electrically connecting the reference tab to the selected reference electrode.

The impedance measurement unit 220 may measure an impedance spectrum between the reference tab and the selected reference electrode by applying an AC current of a predetermined frequency band (for example, 300 kHz to 0.1 Hz) to the reference tab in a state where any one reference electrode is selected by the electrode selection unit 210.

In detail, the impedance measurement unit 220 may apply an AC current of a predetermined frequency band to the reference tab in a state where any one of the plurality of reference electrodes is selected by the electrode selection unit 210. As a response to the AC current, an AC voltage may be applied between the reference tab and the selected reference electrode. The impedance measurement unit 220 may measure the AC voltage and measure an impedance (or, an impedance spectrum) associated with the selected reference electrode based on the measured AC voltage and the AC current.

In addition, if no reference electrode is selected by the electrode selection unit 210, the impedance measurement unit 220 may measure an overall impedance of the secondary battery 100 by applying an AC current to the positive electrode tab 131 and the negative electrode tab 132 in a similar way as above and then measuring an AC voltage of the positive electrode tab 131 and the negative electrode tab 132, based on the signal transmitted from the control unit 230.

The control unit 230 may be implemented in hardware by using at least one selected from the group consisting of application specific integrated circuits (ASICs), digital signal processors (DSPs), digital signal processing devices (DSPDs), programmable logic devices (PLDs), field programmable gate arrays (FPGAs), and electrical units for performing other functions.

The control unit 230 transmits an electrode selection signal to the electrode selection unit 210, which designates at least one of the plurality of reference electrodes per predetermined cycle. At this time, the control unit 230 may output the electrode selection signal according to a predetermined rule. For example, the control unit 230 may notify the electrode selection unit 210 of a reference electrode selected among the plurality of reference electrodes at a predetermined time interval and a selection order and a selection time interval of two or more selected reference electrodes through the electrode selection signal. At this time, the electrode selection signal output by the control unit 230 may vary depending on the state of the secondary battery.

Preferably, the control unit 230 may output an electrode selection signal after a predetermined time from the end of the last charge/discharge of the secondary battery 100. This is to prevent the measurement accuracy of the impedance from being deteriorated due to temporarily rising temperature due to charging and discharging of the secondary battery 100.

When the first reference electrode 141 is selected, if the first impedance measured by the impedance measurement unit 220 is less than the first reference value, the control unit 230 may periodically output only an electrode selection signal that commands to select the first reference electrode 141 closest to the first connection point P1 among the plurality of reference electrodes. That is, if the first impedance between the first connection point P1 and the first reference electrode 141 is less than the first reference value, the selection of reference electrodes other than the first reference electrode 141 may be blocked. This is to prevent unnecessary operations, because the possibility that the secondary battery 100 is in the EOL state is increased when the first impedance is less than the first reference value. The first reference value may be predetermined through a preliminary experiment.

If the first impedance is greater than or equal to the first reference value, the control unit 230 may additionally output an electrode selection signal to select one of the remaining reference electrodes other than the first reference electrode 141. For example, the control unit 230 may output an electrode selection signal for designating the second reference electrode 142 so that the second impedance between the first connection point P1 and the second reference electrode 142 is measured before and after the first impedance is measured by the impedance measurement unit 220.

If the impedance associated with each reference electrode designated by the electrode selection signal transmitted lastly from the control unit 230 is completely measured by the impedance measurement unit 220, the control unit 230 may predict a residual life of the secondary battery 100 based on the measured impedance.

The control unit 230 may predict the residual life of the secondary battery 100 based on the measured first and second impedances within a predetermined time range. Preferably, the control unit 230 may predict the residual life of the secondary battery 100 based on the ratio of the first impedance to the second impedance.

For example, the control unit 230 may reduce the predicted residual life of the secondary battery 100 as the ratio of the first impedance to second impedance increases. This is because the specific resistance of a region relatively closer to the electrode tab 130 is greatly increased than the specific resistance of a region relatively farther therefrom as the secondary battery 100 degrades due to the heat of the electrode tab 130.

If the ratio of the first impedance to the second impedance is greater than or equal to the second reference value (for example, 0.5), the control unit 230 may output an electrode selection signal for designating to select the third reference electrode 143. Accordingly, the electrode selection unit 210 may select the first to third reference electrodes 143 according to a predetermined rule.

If the third impedance between the first connection point P1 and the third reference location M3 is measured by the impedance measurement unit 220, the control unit 230 may predict the residual life of the secondary battery 100 further based on the third impedance. If the ratio of the first impedance to the second impedance is greater than the second reference value, this may mean that it is not needed to replace the secondary battery 100 but there is a risk that the residual life of the secondary battery may be drastically reduced due to the heat of the electrode tab 130. Thus, by additionally utilizing the third impedance between the first and second impedances, it is possible to prepare for a sudden drop of the predicted residual life of the secondary battery 100.

If the ratio of the first impedance to the second impedance is greater than or equal to the third reference value (for example, 0.9) that is greater than the second reference value, the control unit 230 may output an alarm signal for indicating that the secondary battery 100 needs to be replaced. The alarm signal output from the control unit 230 may be converted into a form recognizable by the user through the information guiding unit. The second and third reference values may be predetermined through in a preliminary experiment, similar to the first reference value.

Referring to FIG. 7, the impedance spectrums for the first reference electrode 141 and the second reference electrode 142 may be found. The impedance spectrum for the first reference electrode 141 represents a measurement result obtained while varying the AC current applied to the positive electrode tab 131 within a predetermined frequency band in a state where the first reference electrode 141 is selected by the electrode selection unit 210. The impedance spectrum for the second reference electrode 142 represents a measurement result obtained while varying the AC current applied to the positive electrode tab 131 within a predetermined frequency band in a state where the second reference electrode 142 is selected by the electrode selection unit 210.

At this time, in FIG. 7, the first impedance may be RS1, which is a value of a real component of the total impedance measured at a specific frequency (for example, 1 kHz) within the predetermined frequency band, and the second impedance may be RS2, which is a value of a real component of the total impedance measured at the specific frequency.

The control unit 230 may monitor the degree of irregular degradation of each region of the secondary battery 100 based on the ratio of RS1 to RS2, and then predict the residual life of the secondary battery 100 or notify the same to the user.

Though not shown in the figures, the third impedance may be a value of a real component of the total impedance measured at the specific frequency in a state where the third reference electrode 143 is selected by the electrode selection unit 210, similar to the first impedance and the second impedance.

Meanwhile, in the embodiments in relation to FIGS. 3, 4 and 7, the first connection point P1 have been described mainly, between the first connection point P1 and the second connection point P2. However, the present invention may be equally applied to the second connection point P2. For example, the life prediction apparatus 200 may measure an impedance spectrum of each region between the second connection point P2 and the respective reference locations M1, M2, M3 while varying the AC current applied to the negative electrode tab 132 within a predetermined frequency band.

The embodiments of the present disclosure described above are not implemented only by an apparatus and method, but may also be implemented through a program realizing functions corresponding to the configuration of the embodiment of the present disclosure or a recording medium on which the program is recorded. These embodiments may be easily implemented from the embodiments by those skilled in the art.

While the present disclosure has been described by way of embodiments and drawings, the present disclosure is not limited thereto but may be changed and modified in various ways by those skilled in the art within the equivalent scope of the appended claims.

In addition, since the present disclosure described above may be replaced, modified and changed in various ways without departing from the technical idea of the present disclosure by those skilled in the art, the present disclosure is not limited to the above embodiments or the accompanying drawings, but all or some of the embodiments may be selectively combined to make various modifications.

What is claimed is:

1. A life prediction apparatus of a secondary battery that includes an electrode assembly, a positive electrode tab, a negative electrode tab, a case and a plurality of reference electrodes, the life prediction apparatus comprising:
    an electrode selector including at least one switch;
    a control unit configured to transmit an electrode selection signal designating at least two of the plurality of reference electrodes to the electrode selector;
    the electrode selector configured to select each of the designated reference electrodes at least once at every predetermined cycle using the at least one switch, in response to the electrode selection signal; and
    an impedance measurer configured to:
    form a current path electrically connecting a reference tab, which is any one of the positive electrode tab and the negative electrode tab, to the selected reference electrode, and
    measure an impedance associated with the selected reference electrode, based on an AC voltage between the reference tab and the selected reference electrode by applying an AC current of a predetermined frequency band to the reference tab, in a state where any one of the plurality of reference electrodes is selected by the electrode selector;
    wherein the plurality of reference electrodes include:
    a first reference electrode having one end disposed in the case and connected to a first reference location of the separator and the other end protruding out of the case; and
    a second reference electrode having one end disposed in the case and connected to a second reference location of the separator, which is different from the first reference location, and the other end protruding out of the case,
    wherein the impedance measurer is configured to:
    measure a first impedance associated with the first reference electrode when the first reference electrode is selected by the electrode selector, and
    measure a second impedance associated with the second reference electrode when the second reference electrode is selected by the electrode selector, and
    wherein the control unit is further configured to, when the impedance of each of the designated reference electrodes is completely measured by the impedance measurer, predict a residual life of the secondary battery based on a ratio of the first impedance to the second impedance, wherein the ratio indicates a degree of irregular degradation between different regions of the secondary battery.

2. The life prediction apparatus of a secondary battery according to claim 1, wherein a distance from a first connection location where the positive electrode tab contacts the positive electrode plate to the first reference location is shorter than a distance from the first connection location to the second reference location.

3. The life prediction apparatus of a secondary battery according to claim 2, wherein the plurality of reference electrodes further include:
    a third reference electrode having one end disposed in the case and connected to a third reference location of the separator and the other end protruding out of the case,
    wherein a distance from the first connection location to the third reference location is longer than a distance from the first connection location to the first reference location and shorter than a distance from the first connection location to the second reference location, and wherein the control unit is further configured to transmit an electrode selection signal designating a selection of the third reference electrode to the electrode selector when the ratio of the first impedance to the second impedance is equal to or greater than a reference value.

4. A battery pack, comprising a life prediction apparatus defined in claim 1.

* * * * *